(12) United States Patent
Wasserbauer et al.

(10) Patent No.: US 6,720,585 B1
(45) Date of Patent: Apr. 13, 2004

(54) LOW THERMAL IMPEDANCE DBR FOR OPTOELECTRONIC DEVICES

(75) Inventors: John Wasserbauer, Erie, CO (US);
Ryan Likeke Naone, Boulder, CO (US); Andrew William Jackson, Boulder, CO (US)

(73) Assignee: Optical Communication Products, Inc., Woodland Hills, CA (US)

(*) Notice: Subject to any disclaimer, the term of this patent is extended or adjusted under 35 U.S.C. 154(b) by 0 days.

(21) Appl. No.: 10/044,358

(22) Filed: Jan. 11, 2002

Related U.S. Application Data (60) Provisional application No. 60/262,021, filed on Jan. 16, 2001, and provisional application No. 60/301,386, filed on Jun. 27, 2001.

(51) Int. Cl.[7] .......................... H01L 33/00; H01L 21/00; H01S 5/00
(52) U.S. Cl. .............................. 257/98; 257/94; 257/97; 257/102; 438/46; 438/47; 372/45; 372/46; 372/96
(58) Field of Search ................................ 257/94, 97, 98, 257/102; 438/46, 47; 372/45, 46, 96

(56) References Cited

U.S. PATENT DOCUMENTS

| | | | |
|---|---|---|---|
| 5,422,901 A | | 6/1995 | Lebby et al. |
| 5,757,837 A | * | 5/1998 | Lim et al. .................. 372/50 |
| 5,903,586 A | * | 5/1999 | Ramdani et al. ............ 372/45 |
| 5,991,326 A | | 11/1999 | Yuen et al. |
| 6,396,865 B1 | * | 5/2002 | Mawst et al. ............... 372/96 |

FOREIGN PATENT DOCUMENTS

| | | |
|---|---|---|
| WO | WO 98/07218 | 2/1998 |
| WO | WO 02/17445 A1 | 2/2002 |

OTHER PUBLICATIONS

J. Piprek, *Thermal Conductivity Reduction in GaAs–AlAs Distributed Bragg Reflectors,* IEEE Photonics Technology Letters, Jan. 1998, pp. 81–83, vol. 10, No. 1.

* cited by examiner

*Primary Examiner*—Kang Donghee
(74) *Attorney, Agent, or Firm*—Barlow, Josephs & Holmes, Ltd.

(57) ABSTRACT

A low thermal impedance optoelectronic device includes an optical cavity adjacent a low thermal impedance DBR that provides improved heat dissipation and temperature performance. The thermal impedance of the DBR may be reduced by increasing the relative or absolute thickness of a layer of high thermal conductivity material relative to a layer of low thermal conductivity material for at least a portion of the mirror periods. The thermal impedance may also be reduced by increasing the distance between phonon scattering surfaces by increasing the thickness of the high thermal conductivity layer, the low thermal conductivity layer or both.

28 Claims, 6 Drawing Sheets

FIG. 10

LOW THERMAL IMPEDANCE DBR FOR OPTOELECTRONIC DEVICES

CROSS REFERENCE TO RELATED APPLICATION

This application claims priority to U.S. Provisional Patent Application Ser. No. 60/262,021, filed on Jan. 16, 2001, and U.S. Provisional Patent Application Ser. No. 60/301,386, filed on Jun. 27, 2001 the content of both of which are incorporated herein by reference.

FIELD OF THE INVENTION

The present invention relates generally to optoelectronic devices and more particularly relates to low thermal impedance distributed Bragg reflectors (DBRs) for optoelectronic devices.

BACKGROUND

The performance of semiconductor lasers, including VCSELs, are limited by many things, such as, for example, lossy waveguides and mirrors, current leakage, non-radiative recombination, photon density, etc. A well-designed VCSEL, however, is limited primarily by heat dissipation. Heat generation within the active area of a VCSEL reduces the gain, differential gain and internal quantum efficiency to the point where the threshold, output power or speed may degrade significantly with increasing temperature. Heat is typically generated within the active area through electrical power dissipation, P=IV, where I and V are the operating current and voltage, respectively. The temperature rise above ambient is then the product of the dissipated power and the thermal impedance of the device, $\Delta T = PZ_{therm}$.

SUMMARY

In an exemplary embodiment of the present invention the thermal impedance of a VCSEL is reduced to provide improved heat dissipation and temperature performance. In one aspect of the present invention the overall thermal impedance of an optoelectronic device may be improved by reducing the thermal impedance of one or both of the mirrors of the device. In one aspect of the present invention, a low thermal impedance optoelectronic device includes an active region adjacent a mirror structure having half-wavelength periods formed from alternating layers having asymmetric optical layer thicknesses. In this embodiment, the thermal impedance of the optoelectronic device may be reduced by increasing the thickness of a high thermal conductivity layer relative to a low thermal conductivity layer within the half-wavelength mirror period.

In another aspect of the present invention, a low thermal impedance optoelectronic device includes an active region adjacent a mirror structure having mirror periods where the thickness of a high conductivity layer within a plurality of the mirror periods is increased in a non-uniform fashion. In this embodiment the mirror period having the thickest high thermal conductivity layer occurs closest to the active region. As an example, starting from the active region the high thermal conductivity layers may have thicknesses of $7/4\lambda$, $5/4\lambda$, and $3/4\lambda$, respectively.

In a further aspect of the present invention, a low thermal impedance optoelectronic device includes an active region adjacent a mirror structure having mirror periods where the thickness of the high thermal conductivity layers is uniformly increased throughout the mirror structure. In this embodiment, the thickness of the high thermal conductivity layers may be increased by an integer multiple of one-half of The transmission wavelength of the optoelectronic device.

In a further aspect of the present invention, a low thermal impedance optoelectronic device includes an active region formed adjacent a DBR having a plurality of mirror periods. In this embodiment the mirror periods include a first layer, formed from a first material having a first thermal conductivity and a second layer, formed from a second material having a second thermal conductivity that is greater than the first thermal conductivity. In this embodiment the thickness of at least a portion of the mirror periods is greater than one-half the wavelength of the light emitted by the optoelectronic device to separate the phonon scattering interfaces and improve the thermal impedance of the device.

BRIEF DESCRIPTION OF THE DRAWINGS

These and other features, aspects, and advantages of the present invention will become better understood with regard to the following description, appended claims, and accompanying drawings, in which:

DETAILED DESCRIPTION OF THE INVENTION

In an exemplary embodiment of the present invention the thermal impedance of an optoelectronic device is reduced to provide improved heat dissipation and temperature performance. Conventionally, self-heating within an optoelectronic device is largely localized within a flat square or disk-like area in the optical cavity and dissipated through the bottom mirror. Therefore, the thermal impedance of an optoelectronic device may be reduced by increasing the thermal conductivity of the lower mirror of the device to effect improved heat dissipation through the lower mirror.

A variety of optoelectronic devices, such as for example, vertical cavity surface emitting lasers (VCSELs) utilize a relatively thin optical cavity, typically on the order of one wavelength of the emitted light, to achieve a low threshold current. In operation, such thin optical cavities have a single pass optical gain of approximately 1%, so that upper and lower mirror reflectivities greater than 99% are typically included to achieve lasing. Conventional VCSEL designs typically utilize upper and lower epitaxially-grown semiconductor distributed Bragg reflectors (DBR) to achieve the required reflectivity.

DBRs, as is known in the art, typically comprise multiple pairs of layers often referred to as mirror pairs or periods. A mirror period is typically formed from alternating layers of a quarter wavelength thick, high index of refraction material and a quarter wavelength thick, low index of refraction material. For example, a GaAs based VCSEL typically uses an $Al_{x1}Ga_{1-x1}As/Al_{x2}Ga_{1-x2}As$ material system wherein different refractive indices for each layer of a pair may be achieved by altering the aluminum content $x_1$ and $x_2$ in the layers.

If the thermal conductivity, $\sigma_{therm}$, of the two layers is significantly different, then the overall thermal impedance of the mirror may be reduced by increasing the thickness of the high thermal conductivity layer relative to the low thermal conductivity layer. For example, AlGaAs is a relatively poor thermal conductor and may cause heat to accumulate near the active region. Therefore, in an exemplary embodiment of the present invention, the thermal conductivity of a DBR formed from alternating layers of AlAs/AlGaAs may be improved by increasing the absolute thickness or relative thickness within a mirror period of the AlAs layer, which has a higher thermal conductivity than AlGaAs.

Figure 1:
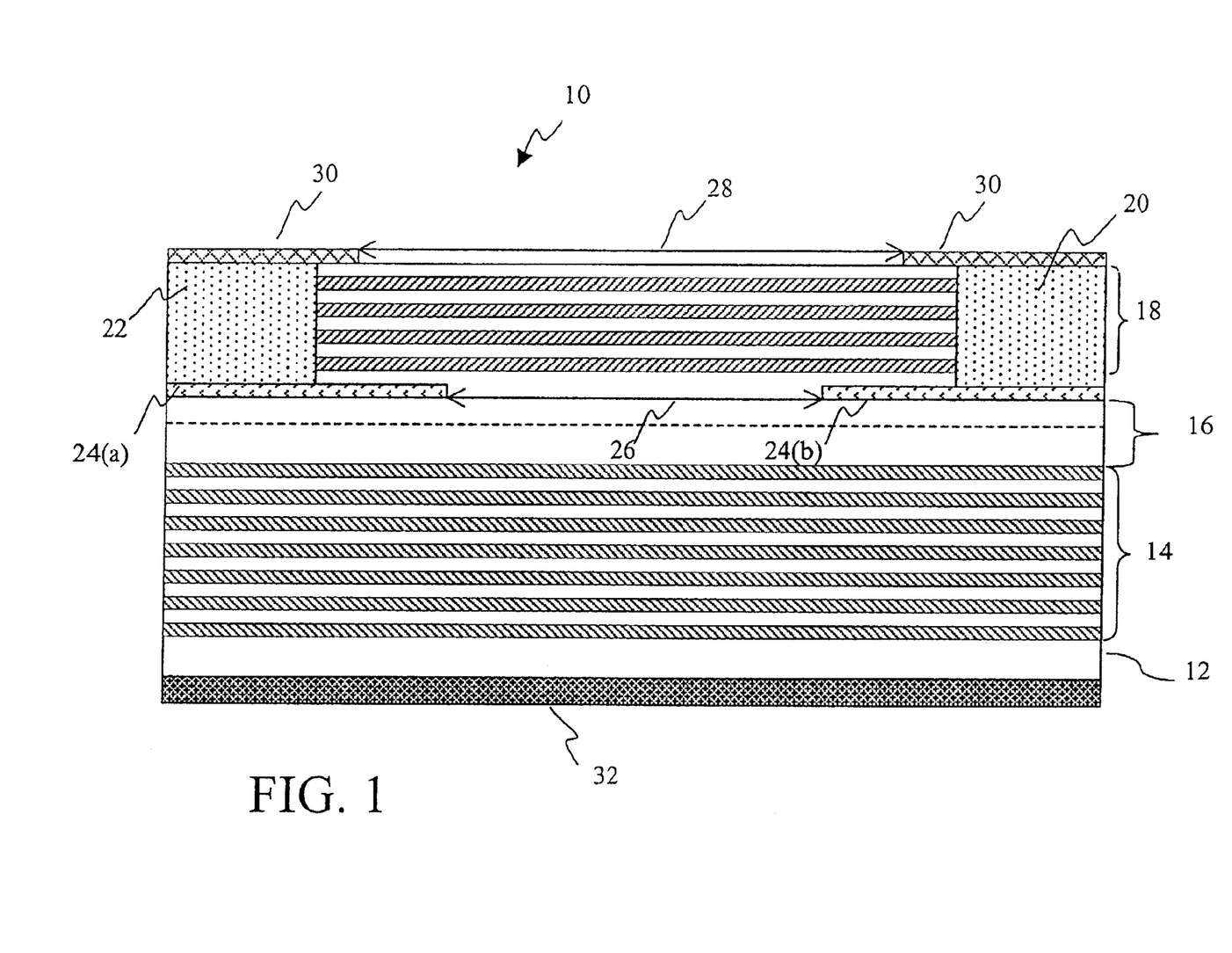
FIG. 1 is a cross-sectional view of a conventional VCSEL having a first mirror, active region and second mirror.

The advantages of the present invention may be best understood in the context of an illustrative example. While an exemplary light emitting device may be constructed from any of the material systems that are well known in the art, the GaAs/AlGaAs material system is discussed for purposes of illustration. Referring to FIG. 1, an exemplary light emitting device 10 is a layered structure epitaxially-grown on a semiconductor substrate 12 An exemplary light emitting device may comprise a lower mirror 14 formed above the semiconductor substrate 12, an optical cavity 16 formed above the lower mirror stack and a second or upper mirror 18 formed above the optical cavity. As is commonly known in the art, the substrate 12 may be formed from gallium arsenide (GaAs) or other suitable materials.

The lower mirror 14, in accordance with an exemplary embodiment of the present invention, may comprise a multi-layered distributed Bragg reflector, (DBR). In an exemplary embodiment of the present invention, the lower mirror may be n-type, doped with a suitable concentration of silicon (Si) or other dopants known to those skilled in the art. The upper mirror may be formed from semiconductor mirror layers, dielectric layers or a hybrid comprising a semiconductor portion and a dielectric portion. Semiconductor mirror layers in the upper mirror may be p-type, doped with a suitable concentration of carbon or other dopants known to those skilled in the art.

Figure 2:
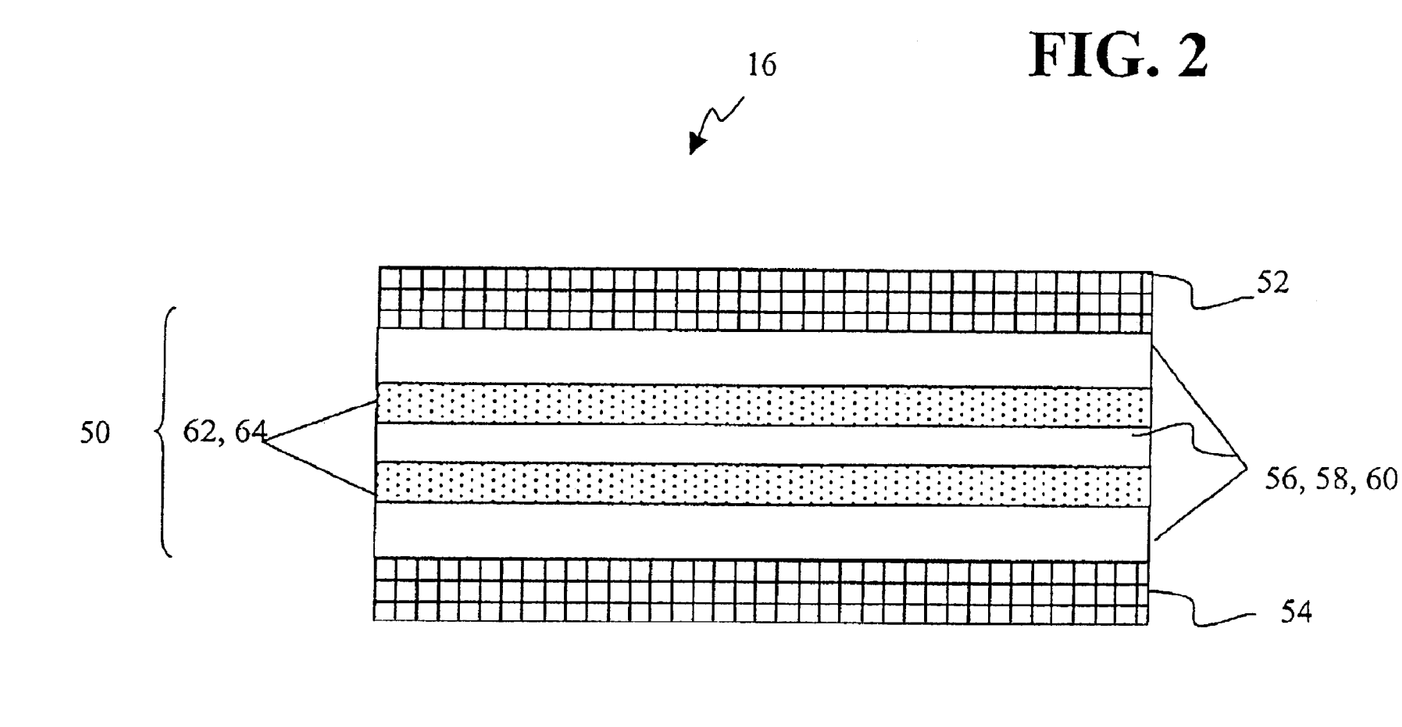
FIG. 2 is a cross-sectional view of a an optical cavity comprising a plurality of quantum wells.

Referring to FIG. 2, the optical cavity 16 in accordance with an exemplary embodiment of the present invention may include an active region 50 surrounded by first and second cladding regions 52 and 54. In the described exemplary embodiment the first and second cladding 52 and 54 may comprise AlGaAs. In the described exemplary embodiment, the active region 50 may comprise one or more quantum wells 56, 58 and 60 made of GaAs with barrier layers 62 and 64 made of $Al_xGa_{1-x}As$ disposed therebetween. As is generally understood in the art, the number of and materials forming the quantum wells 56, 58 and 60 and surrounding barrier layers 62 and 64 can be varied depending on the design. Therefore, the disclosed optical cavity is by way of example only and not by way of limitation.

Referring again to FIG. 1, an exemplary VCSEL structure may be formed into discrete lasers by a combination of current confinement and ohmic contacts. Current confinement may be achieved by implanting ions at multiple energy levels as is known in the art. Implantation regions 20, 22 convert the upper mirror 18 to high resistivity. The encircling high resistance region forms a funnel to provide current confinement as is known in the art. An upper ohmic contact 30 may be disposed above the optical cavity. In the described exemplary embodiment the upper ohmic contact may be a p-type ohmic disposed on the uppermost surface of the VCSEL, and may overlap the current confinement implant regions 20, 22.

The VCSEL may be further contacted with a lower ohmic contact 32 deposited below the optical cavity. In the described exemplary embodiment the lower ohmic contact 32 may be an n-type ohmic contact 32 and may comprise, for example, eutectic gold germanium deposited by electron beam evaporation or sputtering. The described exemplary p-type upper ohmic contact 30 may be, for example, gold with 2% beryllium added or a layered structure of titanium/platinum/gold, preferably deposited by electron beam evaporation. In the described exemplary embodiment the p-type upper ohmic contact has a diameter 28 greater than that of the current constriction 26.

Further, an exemplary single mode VCSEL may include a current constriction 24(a), 24(b). The current constriction 24 preferably forms an encircling high resistance region. In the described exemplary embodiment the diameter of the current constriction aperture 26 is different than the diameter 28 of the current confinement region formed by the blocking implantation regions 20, 22 and the upper ohmic contact 30.

The current constriction 24 may be formed by ion implantation or selective oxidation of a layer having a high concentration of aluminum. In the described exemplary embodiment an oxidation current constriction may be located at or near an axial standing wave null. The current constriction inhibits current injection into the non-lasing material to prevent the diffusion of carriers from the non-lasing regions of the optical cavity into the lasing regions. In addition, the current constriction may reduce the overall threshold current and provide faster optical rise and fall times. In one embodiment, a constriction realized by ion implantation may be placed into the optical cavity reducing the carrier lifetime and thereby minimizing diffusion effects.

The ion implanted current constriction 24(a) and 24(b) is may be formed by the implantation of hydrogen ions at a dose on the order of $5\times10^{14}cm^{-2}$, followed by a short rapid thermal anneal at 550° C. to 600° C. The energy may be calculated using the IBM® program SRIM 2000® whose theory is given in "The Stopping and Range of Ions in Solids", by J. F. Ziegler, J. P. Biersack and U. Littmar, Pergamon Press, N.Y., 1999.

One of skill in the art will appreciate that there are a plurality of suitable VCSEL structures that may be used to practice the present invention. Therefore, the disclosed VCSEL structure is by way of example only and not by way of limitation.

Figure 3:
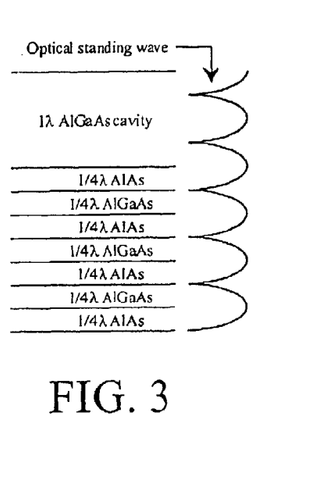
FIG. 3 is a cross-sectional view of a conventional DBR embodiment.

Conventionally, a VCSEL mirror is composed of alternating ¼λ layers of low index of refraction and high index of refraction materials, as illustrated in FIG. 3. In accordance with an exemplary embodiment the overall thermal impedance of the mirror may be reduced by increasing the thickness of the high thermal conductivity layer, in this embodiment the AlAs layer, relative to the low thermal conductivity layer, in this embodiment the $Al_xGa_{1-x}As$ layer.

In an exemplary embodiment, the thickness of the high thermal conductivity layer may be increased by an integral number of half wavelengths so that the optical standing wave peaks remain at the high-to-low index steps to maintain mirror reflectivity. For a lossless material, the thickness may be increased without reducing the reflectivity. For a lossy material, the increased thickness of the high thermal conductivity layer may be balanced against the additional loss incurred.

Figure 4:
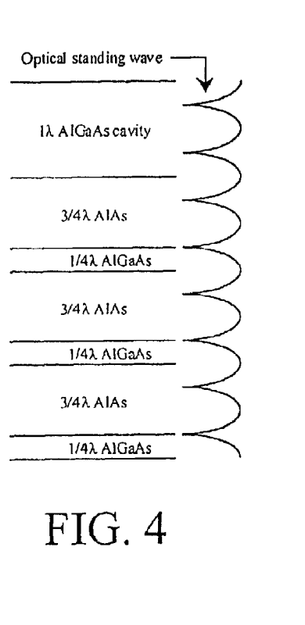
FIG. 4 is a cross-sectional view of an extended mirror having a ¼λ high index material (e.g. AlGaAs), and a ¾λ low index material (e.g. AlAs) layers in accordance with an exemplary embodiment of the present invention.

In a conventional VCSEL that emits at a wavelength in the range of 850 nm, a bottom n-type mirror may comprise on the order of about twenty-nine mirror periods. Each mirror period in such a device may comprise a ¼λ AlAs layer and a ¼λ $Al_xGa_1As$ a layer. In an exemplary embodiment of the present invention the optical thickness of the AlAs layer may be uniformly increased throughout the mirror to be equal to three-fourths (¾λ) of the wavelength of the light emitted by the device as illustrated in FIG. 4. An estimate of the magnitude of the improvement in thermal conductivity may be obtained by weighted averaging of the thermal conductivities of the two materials as illustrated in Equation 1 below:

$$\sigma_{therm} = \frac{t_{AlAs}\sigma_{AlAs} + t_{AlGaAs}\sigma_{AlGaAs}}{t_{AlAs} + t_{AlGaAs}} \quad (1)$$

where $t_{Alas}$ is the thickness of the AlAs layer and $t_{AlGaAs}$ is the thickness of the AlGaAs layer. Utilizing known parameters for AlAs and $Al_{0.25}Ga_{0.75}As$ as summarized in Table 1 below, the estimated thermal conductivity of a conventional ¼λ AlAs/$Al_{0.25}Ga_{0.75}As$ DBR as illustrated in FIG. 3 is $\sigma_{therm}(¼λ)\cong0.55 W/Kcm^2$ and the estimated thermal conductivity for a ¾λAlAs/¼λ $Al_{0.25}Ga_{0.75}As$ DBR as is illustrated in FIG. 4, is $\sigma_{therm}(¾λ)\cong0.78 W/Kcm^2$.

The described exemplary low impedance DBR with extended AlAs layers (¾λ) therefore provides about a 41% improvement over a conventional ¼λ mirror. In practice the improvement may be higher or lower depending on phonon scattering and lateral conductivity.

TABLE 1

| Parameter | AlAs | $Al_{0.25}Ga_{0.75}As$ |
|---|---|---|
| Thermal Conductivity | $\sigma_{AlAs}$ = 0.99 W/Kcm$^2$ | $\sigma_{AlGaAs}$ = 0.04 W/Kcm$^2$ |
| ¼λ Thickness | $t_{AlAs}$ (¼λ) = 713 Å | $t_{AlGaAs}$ (¼λ) = 620 |
| ¾λ Thickness | $t_{AlAs}$ (¾λ) = 2139 Å | N/A |

In operation, most of the heat spreading in the bottom mirror occurs near the optical cavity. Therefore, modification of the mirror periods nearest the optical cavity may be most effective in reducing the thermal impedance of the device. Therefore, in another embodiment of the present invention, the optical thickness of the high thermal conductivity layers may be increased by integer multiples of one-half wavelength in a non-uniform fashion as a function of distance from the optical cavity.

Figure 5:
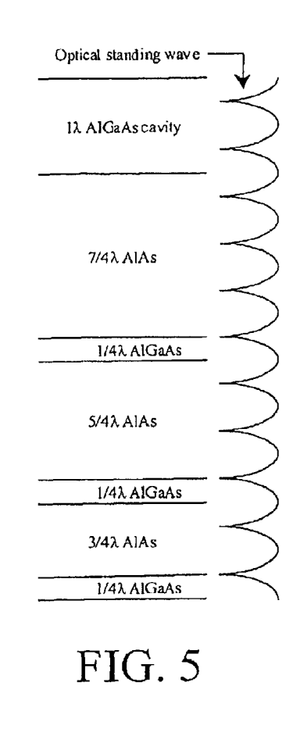
FIG. 5 is a cross-sectional view of a mirror having mirror extensions that are distributed non-uniformly with thicker extensions closer to the active region in accordance with an exemplary embodiment of the present invention.

In the described exemplary embodiment, the high thermal conductivity layer in closest proximity to the optical cavity may have the largest thickness. For example, starting from optical cavity the thickness of the AlAs layers may be for example ⅞λ, 5/4λ, and ¾λ respectively, as illustrated in the cross-sectional view of FIG. 5.

Figure 6:
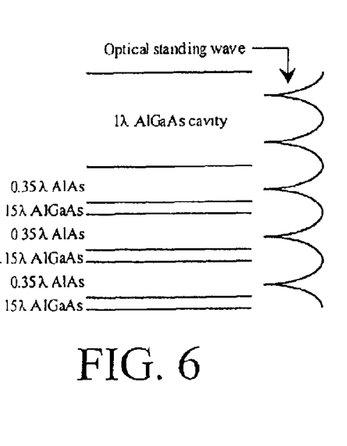
FIG. 6 is a cross-sectional view of an alternate extended mirror comprising a non-symmetric half-wave period mirror design in accordance with an exemplary embodiment of the present invention.

In another embodiment an exemplary mirror structure may comprise a half-wavelength period with alternating mirror layers having asymmetric optical layer thicknesses. For example, in an exemplary embodiment a mirror period may comprise a 0.15λ thick layer of $Al_{0.25}Ga_{0.75}As$ and a 0.35λ thick layer of AlAs as illustrated in FIG. 6.

In all of the above methods, reducing the thermal impedance of the constituent layers is beneficial to the reduction of the overall thermal impedance of the device. For example, reducing the aluminum composition from 25% aluminum (i.e. $Al_{0.25}Ga_{0.75}As$) to 12% aluminum (i.e. $Al_{0.12}Ga_{0.78}As$) will also improve the thermal conductance. In another embodiment, a relatively thick, high thermal conductivity layer, such as, for example, a 5$\mu$ layer of AlAs, may be inserted between the substrate and the bottom mirror. As with layers inserted into the cavity or mirrors, this layer acts as a heat spreader. Unlike those layers, a layer underneath the structure may be made arbitrarily thick without significantly modifying the optical properties of the light emitting device.

Those skilled in the art will understand that various modifications may be made to the described exemplary embodiments. For example, the present invention is not limited to a particular wavelength of operation or to a particular material system. Rather the present invention may be implemented with various combinations of group III-V or group II-VI compound semiconductors, such as, for example, GaAs/AlGaAs, InGaAs/AlGaAs, InP/InGaAsP, AlN/GaN, or AlGaN/SiC that are designed for use at a variety of emission wavelengths.

Figure 7:
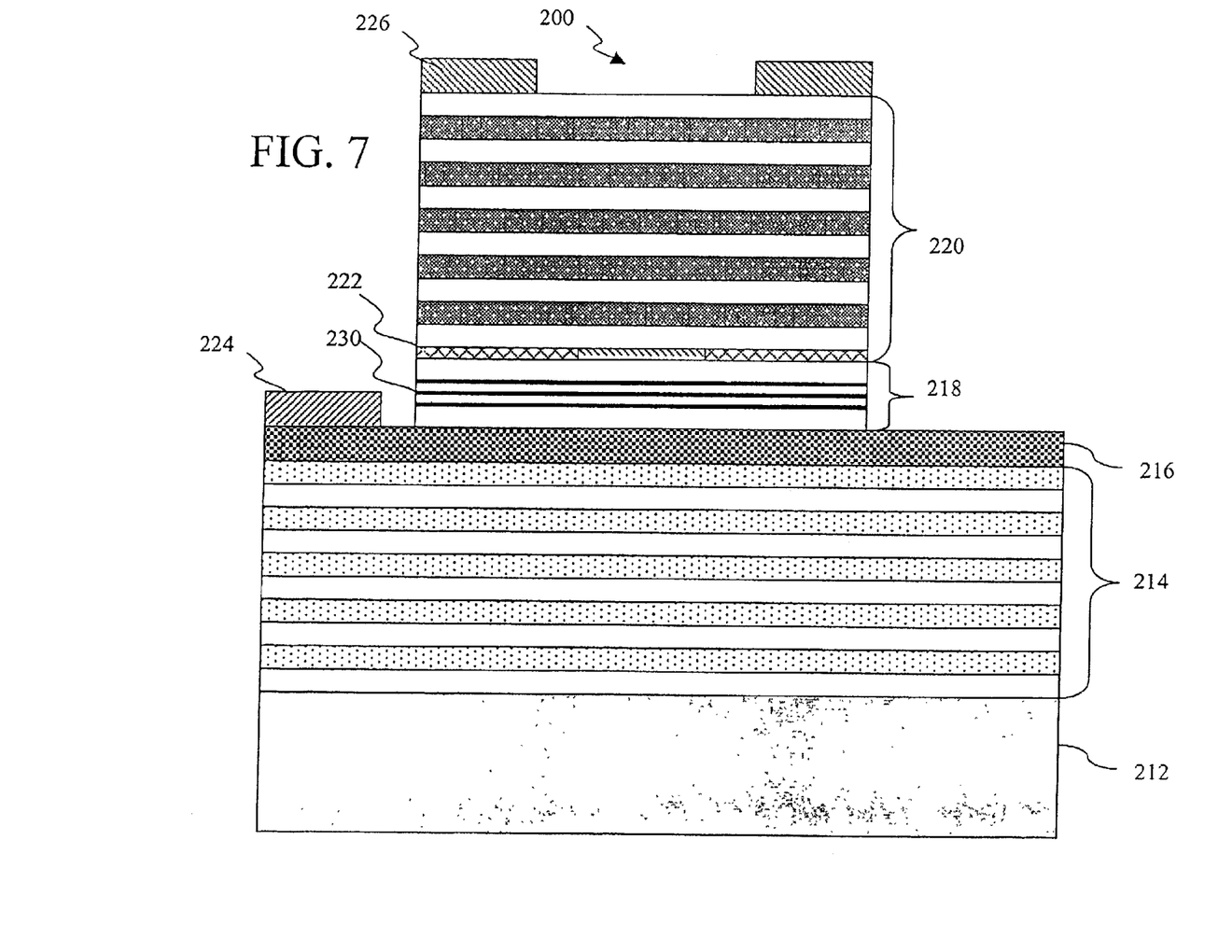
FIG. 7 is a cross-sectional view of a long wavelength VCSEL incorporating a low thermal impedance DBR in accordance with an exemplary embodiment of the present invention.

For example, the present invention may be utilized with a variety of optoelectronic devices that emit at 1200 nm and longer wavelengths. Referring to FIG. 7, an exemplary light-emitting device 200 is a layered structure epitaxially grown on a semiconductor substrate. In an exemplary embodiment, a lower mirror 214 is formed above a semi-insulating substrate 212. In the described exemplary embodiment, an n-type contact layer 216 may be formed above the lower mirror 14 and below an optical cavity 218. Further an upper mirror 220 may be formed above the optical cavity.

In the described exemplary embodiment an oxide aperture 222 may be formed between the optical cavity and the upper mirror. The oxide aperture 222 may comprise, for example, a low index oxidation layer of AlGaAs that is selectively oxidized in part to provide electrical and optical confinement. In an exemplary embodiment of the present invention the semiconductor layers are etched downward to an upper surface of the contact layer 216 forming a mesa to provide access to the oxide aperture and the contact layer.

To electrically contact the VCSEL, a p-type ohmic contact 226 and an intracavity n-type ohmic contact 224 may be deposited above the upper mirror 220 and below the optical cavity 218 respectively. In one embodiment the p-type ohmic contact 226 is deposited before the formation of the mesa and patterned by an etching or lift off step. In this embodiment the p-type ohmic contact 226 may either be protected by an overlying layer deposited and patterned for use as an etch mask, or the contact itself may form at least a part of the etch mask.

The p-type ohmic contact may be formed, for example, by depositing a p-type metalization, such as gold with 2% beryllium added or a layered structure of titanium/platinum/gold above the upper mirror stack defining an annular opening therein by a lithographic masking and lift-off process. The p-type ohmic contact may be deposited by electron beam evaporation. In one embodiment the n-type ohmic contact 224 may be formed, for example, by depositing an n-type metalization such as AuGe/Ni/Au on the upper surface of the contact layer.

In an exemplary embodiment, an annular opening or ohmic aperture may be formed through the p-type ohmic contact 226. In the described exemplary embodiment, the ohmic aperture is generally sized to be at least as large in diameter as the oxide-free portion of the oxide aperture 222, but smaller in diameter than the top surface of the mesa. In this way, light may be efficiently coupled out from the light-emitting device 200 through the central opening while allowing the electrical current to be efficiently coupled from the p-type ohmic contact 226 into the upper mirror 220, and therefrom to the optical cavity 218.

The described exemplary optical cavity may include an active region having one or more undoped $In_yGa_{1-y}As_{1-x}N_x$ quantum wells 230 separated by barrier layers. It has been found that a nitrogen concentration of greater than 1% and less than about 2% provides substantially defect free, high optical quality material. In an exemplary embodiment, the active region may comprise three $In_{0.34}Ga_{0.66}As_{0.988}N_{0.012}$ quantum wells. In the described exemplary embodiment each quantum well 230 may be in the range of about 3–10 nm thick. In accordance with an exemplary embodiment the quantum wells are separated by barrier layers of GaAs that are approximately eighty angstroms thick when separating a pair of adjacent quantum wells and about one hundred sixty to one hundred and eighty angstroms thick otherwise.

In the described exemplary embodiment, the lower mirror 214 is not doped and the upper mirror 220 is doped p-type. In an exemplary embodiment, the upper mirror 220 may comprise twenty-four mirror periods and the lower mirror 214 may comprise thirty mirror periods. The upper and lower mirrors are highly reflective, preferably having greater than 99% reflectivity.

In an exemplary embodiment, the upper mirror 220 comprises quarter-wavelength-thick alternating layers of AlGaAs/GaAs for operation at a wavelength near 1300 nm. One of skill in the art will appreciate that the Al content in the AlGaAs upper mirror stack may vary, preferably in the range of about 0.8–0.96.

Further, in the described exemplary embodiment the lower mirror stack may comprise alternating layers of undoped binary pairs of AlAs and GaAs with abrupt interfaces at the layer edges. Advantageously, the utilization of binary pairs having a 100% concentration of Al reduces the overall thermal impedance of the lower mirror. The thermal impedance of the lower mirror may again be further reduced by increasing the absolute thickness or relative thickness within a mirror period of the AlAs layer, which has a higher thermal conductivity than GaAs.

Figure 8:
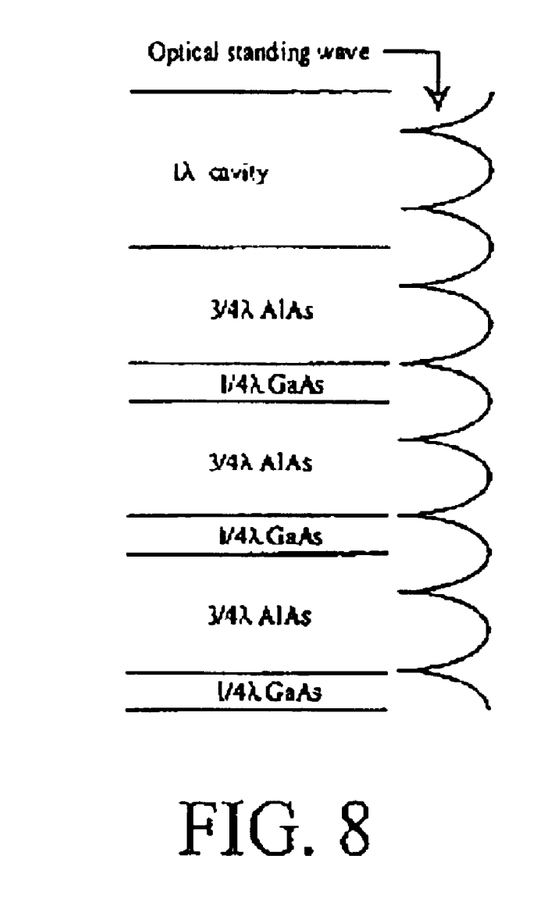
FIG. 8 is a cross-sectional view of an extended mirror having a ¼λ high index material (e.g. GaAs), and a ¾λ low index material (e.g. AlAs) layers in accordance with an exemplary embodiment of the present invention.

In a conventional 1300nm VCSEL, the bottom mirror may comprise on the order of thirty undoped mirror periods, wherein each mirror period comprises a ¼λ AlAs layer and a ¼λ GaAs layer. In an exemplary embodiment of the present invention the thickness of the AlAs layer may be uniformly increased throughout the mirror to three-fourths (¾λ) of the wavelength of the light emitted by the device as illustrated in FIG. 8. An estimate of the magnitude of the improvement in thermal conductivity may be obtained by weighted averaging of the thermal conductivities of the two materials as illustrated in Equation 2 below:

$$\sigma_{therm} = \frac{t_{AlAs}\sigma_{AlAs} + t_{GaAs}\sigma_{GaAs}}{t_{AlAs} + t_{GaAs}} \quad (2)$$

where $t_{Alas}$ is the thickness of the AlAs layer and $t_{GaAs}$ is the thickness of the GaAs layer. Therefore, utilizing known parameters for AlAs and GaAs as summarized in Table 2 below, the estimated thermal conductivity of a conventional ¼λ AlAs/GaAs DBR is $\sigma_{therm}(¼λ) \cong 0.74$ W/Kcm² and the estimated thermal conductivity for the described exemplary ¾λ AlAs/¼λ GaAs DBR as illustrated in FIG. 8 is $\sigma_{therm}(¾λ) \cong 0.87$ W/Kcm². The described exemplary low impedance DBR with extended AlAs layers (¾λ) therefore provides about an 18% improvement over a conventional ¼λ mirror. In practice the improvement may be higher or lower depending on phonon scattering and lateral conductivity.

TABLE 2

| Parameter | AlAs | GaAs |
| --- | --- | --- |
| Thermal Conductivity | $\sigma_{AlAs}$ = 0.99 W/Kcm² | $\sigma_{GaAs}$ = 0.44 W/Kcm² |
| ¼λ Thickness | $t_{AlAs}$ (¼λ) = 1090 Å | $t_{GaAs}$ (¼λ) = 928.6 Å |
| ¾λ Thickness | $t_{AlAs}$ (¾λ) = 3270 Å | N/A |

Those skilled in the art will understand that the present invention is not limited to a particular mirror extension design or a particular wavelength of operation. Rather various modifications may be made to the mirror structure to reduce the thermal impedance of the structure. For example, heat conduction in semiconductors is, at least in part, dependent upon phonon transport. Phonon scattering at the interface between alternating mirror layers may significantly impede phonon transport and may therefore be detrimental to the thermal conductivity of relatively thin, multi-layer devices.

Accordingly, in an alternate embodiment of the present invention, the thermal impedance of a DBR may be lowered by increasing the spacing between phonon scattering interfaces (i.e. increasing the thickness of the alternating layers) in the DBR. One of skill in the art will appreciate that a variety of structures may provide the increased spacing between phonon scattering interfaces.

Figure 9:
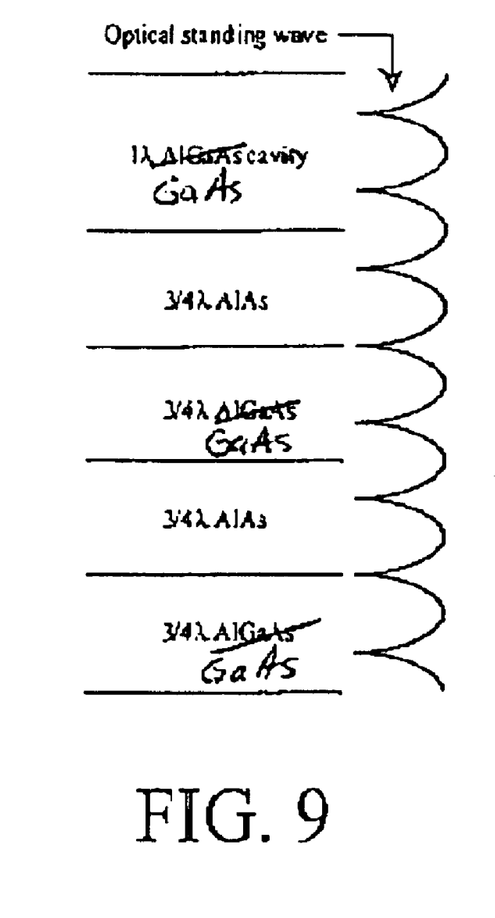
FIG. 9 is a cross-section view of a extended mirror formed from binary pairs wherein the optical thickness of one or both of the alternating layers may be increased.

In the case of a DBR comprising binary pairs, such as for example, AlAs/GaAs, it may be advantageous to increase the thickness of either the high thermal conductivity layer, the low thermal conductivity layer or both. For example referring to FIG. 9, by increasing the thickness of both the AlAs and GaAs layers from ¼λ to ¾λ, the average thermal conductivity stays constant, but phonon scattering may be significantly reduced.

In operation the preferred mirror structure may vary in accordance with the requirements of a given application. For example, one may choose to increase the thickness of the low thermal conductivity layer for manufacturing reasons (i.e. material is more readily grown). Similarly, the mirror structure may be influenced by the loss within the material, increased diffraction scattering and reduced optical confinement.

Figure 10:
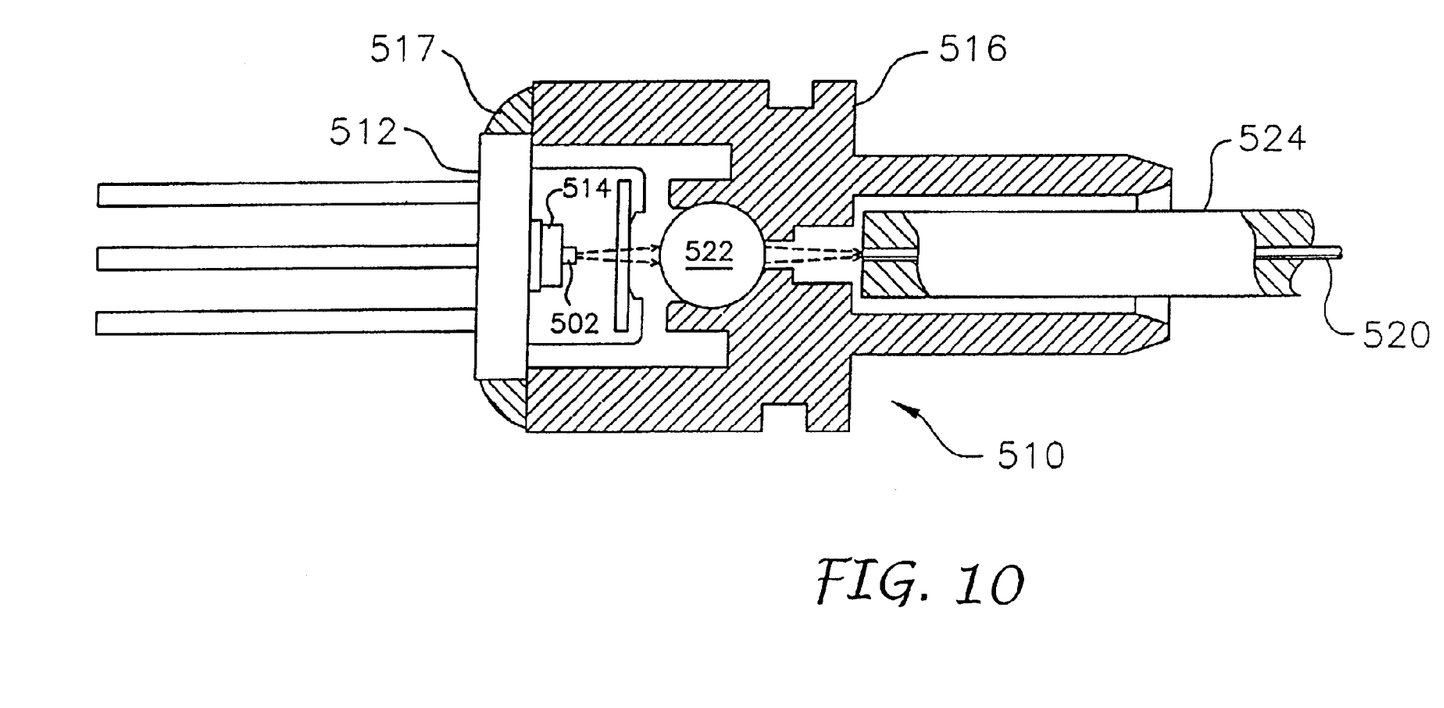
FIG. 10 is a side view, partly in cross-section, of an optical subassembly incorporating a VCSEL having a low thermal impedance mirror in accordance with an exemplary embodiment of the present invention.

One of skill in the art will appreciate that the present invention may be readily integrated into in a variety of electro-optical applications. For example, FIG. 10 illustrates the integration of an exemplary VCSEL having a low thermal impedance DBR as illustrated in FIGS. 1 or 7, mounted into an optical subassembly (OSA) 510. The OSA enables application of DC biasing and AC modulation signals to the VCSEL. The OSA generally comprises an electrical package 512 containing the VCSEL 502 and a power monitoring photodetector 514.

The electrical package may be bonded to a precision molded plastic housing 516. The bonding process including conventional bonding material 517 may involve active alignment to optimize the coupling of the laser light into an optical fiber 520, as is conventional in the art. The described exemplary OSA may include a focusing element, such as, for example, a ball lens 522 for coupling the light into the optical fiber. A ferule 524 provides alignment of the optical fiber. After the electrical package 512 and housing 516 are bonded together, the fiber is removed and the OSA 525 is complete. An exemplary optical subassembly is also described in U.S. patent application Ser. No. 08/900,507, filed Jul. 25, 1997, the contents of which are hereby incorporated by reference.

The incorporation of a low thermal impedance, high reflectivity DBR into the VCSEL 502, reduces the temperature sensitivity of the device and therefore reduces the manufacturing complexity of the OSA. The described exemplary VCSEL and OSA may therefore be more readily manufactured with increased yield and lower overall product cost that comparable conventional OSAS.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention.

For example, the features of the described exemplary VCSEL structures may be combined in a variety of different manners to form low thermal impedance devices. In addition, the described exemplary light emitting devices may be manufactured in the form of arrays, wherein the devices are epitaxially grown on a single substrate, processed and auto-tested as a whole wafer.

Conventionally, individual devices within an array may be defined by implanting protons in the form of an annular isolation region that confines current flow within the individual VCSEL devices, while also electrically isolating each device from the other VCSEL devices in the array. However, in the case of long wavelength VCSELs the thickness of the upper mirror may exceed the maximum depth to which hydrogen or other ions may be reasonably implanted. In these instances mesas may be formed to isolate individual devices on the wafer.

The invention itself herein will further suggest solutions to other tasks and adaptations for other applications to those skilled in the art. It is therefore desired that the present it embodiments be considered in all respects as illustrative and not restrictive, reference being made to the appended claims rather than the foregoing description to indicate the scope of the invention.

What is claimed is:

1. An optoelectronic device, comprising:
    an active region adjacent a first distributed bragg reflector (DBR) comprising a plurality of mirror periods wherein each of said mirror periods comprise a first layer formed from a first material having a first thermal conductivity and a second layer formed from a second material having a second thermal conductivity that is greater than said first thermal conductivity and, wherein the optical thickness of said first layer does not equal the optical thickness of said second layer for at least a portion of the plurality of mirror periods.

2. The optoelectronic device of claim 1 wherein the optical thickness of said first layers is one fourth of a wavelength of light emitted by said optoelectronic device and wherein the optical thickness of said second layers is an odd integer multiple of one fourth of the wavelength of the light emitted by said optoelectic device, said odd integer multiple being greater than 1.

3. The optoelectronic device of claim 1 wherein the optical thickness of the second layer of at least said portion of mirror periods varies in a non-uniform fashion as a function of distance from said active region.

4. The optoelectronic device of claim 3 wherein the mirror period in closest proximity to the active region comprises the thickest second layer.

5. The optoelectronic device of claim 4 wherein the optical thickness of the second layers decreases by an integer multiple of one half of a wavelength of light emitted by said optoelectronic device for mirror periods as a function of distance from said active region.

6. The optoelectronic device of claim 1 wherein the optical thickness of said fist layer is less than the optical thickness of said second layer and the sum of the optical thicknesses of said pair of layers is one half of a wavelength of light emitted by said optoelectronic device.

7. The optoelectronic device of claim 1 further comprising a second DBR adjacent said active region.

8. The optoelectronic device of claim 7 wherein said second DBR comprises a plurality of semiconductor mirror layers.

9. The optoelectronic device of claim 7 wherein said second DBR comprises a plurality of dielectric mirror layers.

10. The optoelectronic device of claim 7 wherein said second DBR comprises a hybrid mirror comprising a dielectric portion and a semiconductor portion.

11. The optoelectronic device of claim 1 wherein said active region comprises at least one quantum well.

12. The optoelectronic device of claim 11 wherein said at least one quantum well comprises GaAs.

13. The optoelectronic device of claim 11 wherein said at least one quantum well comprises $In_{1-x}Ga_xAs_{1-y}N_y$.

14. The optoelectronic device of claim 1 wherein the first material comprises $Al_xGa_{1-x}As$ and the second material comprises AlAs.

15. The optoelectronic device of claim 14 wherein x equals zero.

16. An optoelectronic device, comprising;
    an active region formed adjacent a distributed bragg reflector (DBR),
    said DBR comprising a plurality of mirror periods wherein each of said mirror periods comprise a first layer, formed from a first material GaAs having a first thermal conductivity and a second layer, formed from a second material AlAs having a second thermal conductivity that is greater than said first thermal conductivity,
    wherein the optical thickness of at least a portion of said mirror periods is greater than one-half wavelength of light emitted by said optoelectronic device, and further wherein the optical thickness of said first layers is greater than the optical thickness of said second layers for at least said portion of said mirror periods having an optical thickness greater than one-half the wavelength of light emitted by said optoelectronic device.

17. An optoelectronic device comprising:

an active region; and a distributed bragg reflector (DBR) adjacent said active region, said DBR comprising a plurality of mirror periods wherein each of said mirror periods comprise a first layer formed from a first material having a first thermal conductivity and a second layer formed from a second material having a second thermal conductivity, said second thermal conductivity being greater than said first thermal conductivity, said plurality of mirror periods including a first mirror period adjacent said active region, said second layer of said first mirror period being adjacent said active region, said second layer of said first mirror period having an optical thickness greater than an optical thickness of said first layer of said first mirror period, said each of said plurality of mirror periods having an optical thickness equal to a multiple of ½ wavelength of light emitted by said optoelectronic device.

18. The optoelectronic device of claim 17 wherein the thickness of said first layers is ¼ of a wavelength of light emitted by said optoelectronic device and wherein the optical thickness of said second layers is an odd integer multiple of ¼ of a wavelength of light emitted by said optoelectronic device.

19. The optoelectronic device of claim 17 wherein the thickness of the second layer of at least a portion of said plurality of mirror periods varies in a non-uniform fashion as a function of distance from said active region.

20. The optoelectronic device of claim 17 further comprising a second DBR adjacent an opposite side of said active region.

21. The optoelectronic device of claim 20 wherein said second DBR comprises a plurality of semiconductor mirror layers.

22. The optoelectronic device of claim 20 wherein said second DBR comprises a plurality of dielectric mirror layers.

23. The optoelectronic device of claim 20 wherein said second DBR comprises a hybrid mirror comprising a dielectric portion and a semiconductor portion.

24. The optoelectronic device of claim 17 wherein said active region comprises at least one quantum well.

25. The optoelectronic device of claim 24 wherein at least one quantum well comprises GaAs.

26. The optoelectronic device of claim 24 wherein at least one quantum well comprises $In_{1-x}Ga_xAs_{t-y}N_y$.

27. The optoelectronic device of claim 17 wherein said first material comprises $Al_xGa_{1-x}As$ and said second material comprises AlAs.

28. The optoelectronic device of claim 27 wherein x equals zero.

* * * * *